(12) United States Patent
Martin et al.

(10) Patent No.: US 7,683,642 B2
(45) Date of Patent: Mar. 23, 2010

(54) APPARATUS AND METHOD FOR METERING CONTACT INTEGRITY

(75) Inventors: Warren Thomas Martin, Lafayette, IN (US); John Voisine, Lafayette, IN (US)

(73) Assignee: Landis+Gyr, Inc., Lafayette, IN (US)

(*) Notice: Subject to any disclaimer, the term of this patent is extended or adjusted under 35 U.S.C. 154(b) by 338 days.

(21) Appl. No.: 11/906,116

(22) Filed: Sep. 28, 2007

(65) Prior Publication Data

US 2008/0116906 A1    May 22, 2008

Related U.S. Application Data

(60) Provisional application No. 60/847,699, filed on Sep. 28, 2006.

(51) Int. Cl.
  *G01R 27/16* (2006.01)
  *G01R 19/00* (2006.01)

(52) U.S. Cl. .................. 324/691; 324/76.11; 324/142

(58) Field of Classification Search ............... 324/600, 324/691, 76.11, 142, 74
See application file for complete search history.

(56) References Cited

U.S. PATENT DOCUMENTS

| 4,413,230 | A | * | 11/1983 | Miller | ............... 324/142 |
| 6,016,054 | A | * | 1/2000 | Slater et al. | ............... 324/142 |

* cited by examiner

*Primary Examiner*—Vincent Q Nguyen
(74) *Attorney, Agent, or Firm*—Maginot, Moore & Beck

(57) ABSTRACT

An arrangement for use in connection with an electricity meter includes an electricity meter housing and at least one connection between a first conductor and a second conductor carrying line voltage. The arrangement further includes a processing circuit that is configured to obtain a first voltage measurement within the meter housing on a first side of the at least one connection, and to obtain a second voltage measurement on a second side of the at least one connection. The processing circuit is further configured to determine a value corresponding to an impedance across the at least one connection.

20 Claims, 3 Drawing Sheets

APPARATUS AND METHOD FOR METERING CONTACT INTEGRITY

This application claims the benefit of U.S. Provisional Patent Application Ser. No. 60/847,699, filed Sep. 28, 2006, which is incorporated herein by reference.

FIELD OF THE INVENTION

The present invention relates generally to utility meters, and more particularly, to electricity meters that includes electrical contacts that are subject to wear.

BACKGROUND OF THE INVENTION

Electricity meters that measure energy consumption or power consumption typically connect between a utility power line and a load. For example, an electricity meter for a residential customer is often connected at the point at which the electrical system of the residence connects to the utility line. The meter may thereby perform measurements regarding the energy consumed by the load.

Utility meters often include one or more electrical contacts across which the load voltage and a significant amount of current may be found. For example, meters often have blades that connect across the power line to enable the measurement of load current and load voltage from within the meter. The blades are received by the jaws of a meter mounting device of the building. The jaws use spring compression to retain the blades securely. If the meter is to be replaced or repaired, the meter may be pulled out of the mounting device, and hence the blades out of the jaws. Although the blades and jaws are usually mechanically robust, they are nevertheless subject to wear, and possibly corrosion, particularly if the meter has been removed or replaced several times. If wear on the jaws is significant, or if the jaws have corrosion, then there is a possibility of introducing a non-trivial resistance at the jaw/blade connection, which is undesirable. Similarly it is possible for the spring used to effect jaw compression to lose some force with aging or heating over time resulting in a reduction of jaw compression force.

Likewise, certain meters have switches that allow for disconnection of electrical service to a load. For example, many meters allow for remote switching off of the load. Such switches necessarily must have substantial contacts because they carry the entire current of the load when the switch is closed. If these switches are used with some frequency, then there is a potential for degradation. Degradation of the switch contacts increases the resistance over the switch contacts. Such resistance creates additional power loss within the meter, which is undesirable.

SUMMARY OF THE INVENTION

At least some embodiments of the present invention addresses the above problems by using metering circuitry to determine a voltage drop or resistance of a normally conductive contact or connection. If the voltage drop or resistance is above a threshold, then the metering circuitry may generate an alarm message for storage, display or communication.

A first embodiment is an arrangement for use in connection with an electricity meter that includes an electricity meter housing and at least one connection between a first conductor and a second conductor carrying line voltage. The arrangement further includes a processing circuit that is configured to obtain a first voltage measurement within the meter housing on a first side of the at least one connection, and to obtain a second voltage measurement on a second side of the at least one connection. The processing circuit is further configured to determine a value representative of a resistance across the at least one connection.

The connection may be in a disconnect switch, or the actual blade-jaw connections of the meter.

A second embodiment is an arrangement that also includes a processing circuit and at least one connection between a first conductor and a second conductor carrying line voltage. The processing circuit is disposed within an electricity meter housing. The processing circuit is configured to obtain a first voltage measurement on a first side of the at least one connection, and a second voltage measurement on a second side of the at least one connection. The processing circuit is further operable to determine a value representative of a resistance across the at least one connection.

The above described features and advantages, as well as others, will become more readily apparent to those of ordinary skill in the art by reference to the following detailed description and accompanying drawings.

DETAILED DESCRIPTION

Figure 1:
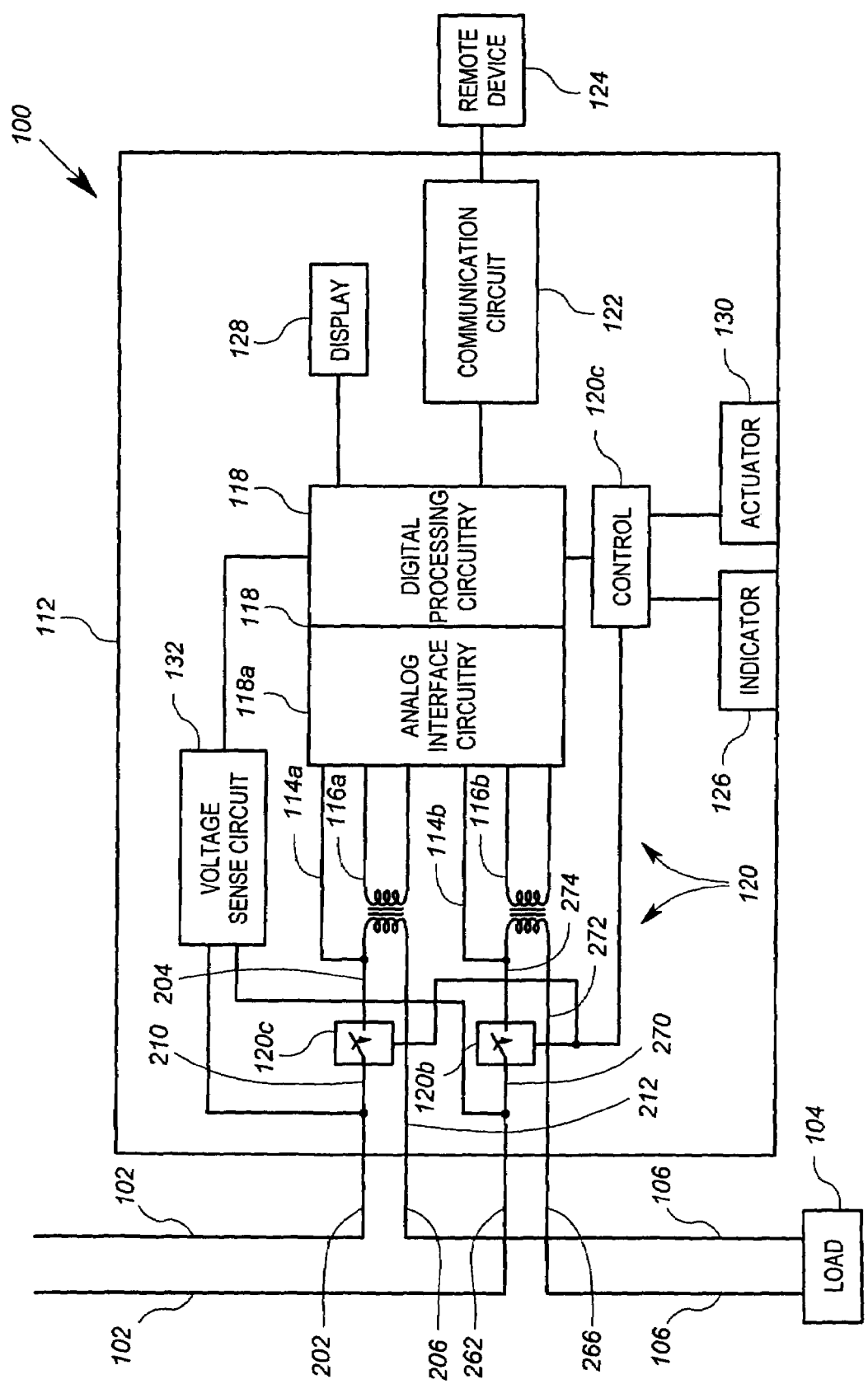
FIG. 1 shows a schematic diagram of an exemplary meter according to an embodiment of the invention, connected to an electrical system.

Referring now to the drawings, and more particularly to FIG. 1, a diagram of an electrical utility meter 100 constructed according to aspects of the present invention is shown. It will be appreciated that the one or more inventive aspects described herein may be implemented in many configurations of electricity meters, wherein the meter includes electrical contacts, and is not limited to one having the specific architecture of the meter in FIG. 1.

In FIG. 1, the meter 100 is operably coupled to utility power lines 102. The utility power lines 102 are connected to a source of electricity, such as a power transmission and distribution system, not shown. A load 104 (typically a consumer of electrical power) is connected to the power lines 102 through feeder lines 106. The meter 100 is operably coupled at the intersection of the feeder lines 106 and the power lines 102 to detect the amount of electricity delivered to the load 104. In the exemplary meter 100, the components of the meter 100 actually provide the connection between the power lines 102 and the feeder lines 106. The meter 100 is operable to, among other things, generate metering information representative of a quantity of electrical energy delivered to the load 104.

The meter 100 disclosed herein includes a housing 112, first and second current coils 204, 274, first and second voltage sensors 114a, 114b, first and second current sensors 116a, 116b, electronic meter processing circuitry 118, a service disconnect arrangement 120 that includes disconnect switches 120a, 120b, a communication circuit 122, a service indicator 126, a display 128, an actuator 130 and a voltage sense circuit 132.

The housing 112 is disposed over the meter 100 and encases various components thereof. Various meter housing types, forms and shapes are known and are suitable for use as the housing 112. For example, in U.S. meters, electricity meter housings are generally cylindrical in nature, while in other countries, the housing may be rectangular. The housing 112 generally protects the components of the meter 100 from environmental conditions, thereby allowing the meter 100 to be placed outside, in an industrial setting, or elsewhere.

The meter 100 connects to the power lines through a series of blades 210, 212, 270, 272 and respective jaws 202, 206, 262, 266. Each jaw 202, 262 is directly connected to one of the power lines 102, and each jaw 206, 266 is connected to one of the feeder lines 106. Each jaw 202, 262 is configured to receive a respective first meter blade 210, 270, and each jaw 206, 266 is configured to receive a respective second meter blade 212, 272. In one phase of the meter, the blade 210, the switch 120a, the current coil 204 and the blade 212 form a line voltage path through the meter 100. In the other phase of the meter, the blade 270, the switch 120b, the current coil 274 and the blade .272 form a line voltage path through the meter 100.

The voltage sensors 114a, 114b and current sensors 116a, 116b, which are secured within the housing 112, are operable to receive voltage and current signals representative of voltage and current provided to the load 104 and generate measurement signals therefrom. In particular, the measurement signals generated by the voltage sensors 114a, 114b have a waveform that is representative of the voltage on the power lines 102 and measurement signals generated by the current sensors 116a, 116b are analog signals each having a waveform representative of the current provided over the feeder lines 106 to the load 104.

To this end, any suitable voltage sensor may be employed, including a wire connection that simply obtains the voltage on the current coils 204, 274 or on the blades 210, 270. In this embodiment, the voltage sensors 114a, 114b are connected to he respective current coils 204, 274 downstream of the respective switches 120a, 120b. In other embodiments, the voltage sensors 114a, 114b can be connected upstream of the switches 120a, 120b, as to the blades 210, 270. In either case, a voltage divider may be provided to scale the voltage for digitization. Such a voltage divider may form part of the voltage sensors 114a, 114b, or may be part of the processing circuit 118. Similarly, any suitable current sensor may be employed, including a toroidal transformer that extends around the current coils 204, 274, respectively.

For purposes of example and explanation, FIG. 1 illustrates two voltage sensors 114a, 114b and current sensors 116a, 116b for generating measurement signals for two-phase electrical service, or for two sides of a 240-volt single-phase three-wire electrical service. However, it will be intuitive to those skilled in the art that the principles of the present invention may also be applied to three-phase power systems.

The processing circuit 118 is operable to receive the analog measurement signals from the voltage sensors 114a, 114b and the current sensors 116a, 116b and generate energy consumption data therefrom. According to an exemplary embodiment, the processing circuit 118 includes analog interface circuitry 118a that receives and digitizes the measurement signals, and digital processing circuitry 118b that processes the digitized measurement signals to thereby generate the energy consumption data. Such circuits are well known in the art. In a generally well-known example, the processing circuit 118 samples the voltage and current measurement waveforms, and then multiples contemporaneous samples of voltage and current to obtain a short duration energy measurement approximation (i.e. less than 1 millisecond). These sample-products are then accumulated to provide a measure of electricity consumption. Other variants and modifications of this basic formula are known and may be used.

According to an alternative embodiment, however, the processing circuit 118 generates the energy consumption data by operating directly upon the analog measurement signals. As is known in the art, the processing circuit 118 may include one or more integrated circuits.

The service disconnect circuit 120 comprises one or more service disconnect switches 120a, 120b and a logical control portion 120c. It will be appreciated that the logical control portion 120c and the processing circuit 118 may suitably share some or all of the same components and/or circuitry. However, in other embodiments, the control portion 120c of the service disconnect circuit and the processing circuit 118 of the meter 100 are completely distinct circuits.

Referring again to FIG. 1, one or more service disconnect switches 120a, 120b are operably coupled to selectively connect and disconnect the power lines 102 to the load 104 under the control of the control circuit 120c. In general, the service disconnect circuit 120 has a connected state, a disconnected state, and an armed state. The states of the service disconnect circuit 120 are maintained within the control portion 120c. The control portion 120c controls the service disconnect switches 120a in accordance with the state logic.

More specifically, in the connected state, the service disconnect switches 120a, 120b are closed, and thereby couple the power lines 102 to the load 104 so as to provide electrical power thereto. In the disconnected and armed states, the service disconnect switches 120a, 120b are open, thereby operably decoupling the power lines 102 from the load 104 so as to remove the supply of electrical power therefrom. The "armed" state is a transitional state between the disconnected state and the connected state.

It is noted that the service disconnect switches 120a, 120b have physical contacts that are prone to wear and tear. As they wear, they can develop resistive qualities, which undesirably results in a large voltage drop and dissipation of power.

In the general operation of the disconnect circuit 120, the service disconnect circuit 120 changes from the connected state to the disconnected state in response to a first signal received from the processing circuit 118, and changes from the disconnected state to the armed state in response to a second signal within the processing circuit 118. The processing circuit 118 provides these signals to the control logic 120c.

It should be noted that the signals that cause the state changes may originate from a remote location from a remote device 124 via the communication circuit 122. For example, if a utility must shut down power to the load 104 for one or more reasons, the utility company may use the remote device 124 to provide a disconnect command to the meter 100.

To this end, the communication circuit 122 is configured to receive signals from the remote device 124 via a tangible communication link (e.g., cable, wire, fiber, etc.), or via a wireless communication link. According to one embodiment, the communication circuit 122 is operable to receive a disconnect signal from the remote device 124. In response to the disconnect signal, the communication circuit 122 provides information representative of the disconnect signal to the processing circuit 118. The processing circuit 118 in turn provides the first signal to the control portion 120c of service disconnect circuit 120, thereby causing the service disconnect circuit 120 to change from the connected state to the disconnected state. In the disconnected state, the service disconnect switches 120a and 120b disconnect the feeder lines 106 from the power lines 102.

The communication circuit 122 is also operable to receive an arm signal from the remote device 124. In response to the arm signal, the communication circuit 122 provides information representative of the arm signal to the processing circuit 118. The processing circuit 118 in turn provides the second signal to the service disconnect circuit 120, thereby causing the service disconnect circuit 120 to change from the disconnected state to the armed state. In the armed state, as discussed above, the switches 120a, 120b do not immediately reconnect the feeder line 106 to the power lines 102.

The indicators 126 include one or more electronic indicators 126 are operably coupled to the control portion 120c and provide visual signals regarding operation of the service disconnect circuit 120. Thus, the indicators 126 identify to the customer an indication of whether the meter 100 is in the "connected", "disconnected" or "armed" state.

The display 128 is operably coupled to the processing unit 118 and provides a visual display of information, such as information regarding the operation of the meter 100. For example, the display 128 may provide a visual display regarding the energy consumption measurement operations of the meter 100. The display 128 and the indicator 126 may be separate and distinct elements of the meter 100, as shown in FIG. 1, or may be combined into a single display unit. As disclosed herein, the display 128 may also display when the processing circuit 118 determines when a connection in the power line path of the meter 100 has a resistance that exceeds a threshold.

The actuator 130 is operably coupled to each service disconnect switch 120a, 120b. When actuated, the actuator 130 causes one or more service disconnect switches 120 to change from the armed state to the connected state. To this end, the actuator 130 is coupled to the control portion 120c of the service disconnect switch 120, or may be directly coupled to each service disconnect switch 120a and 120b. The actuator 130 is preferably disposed on the housing 112, and is accessible from an external portion of the housing 112. The actuator 130 may, for example, be embodied as one or more pushbutton mechanisms or other elements that may be actuated by a user.

As discussed above, the disconnect switches 120a, 120b have contacts that may be opened and closed from time to time, and which can carry relatively high voltage and current. The contacts of the switches 120a, 120b are prone to wear. An arrangement according to one embodiment of the invention incorporates various elements of the meter 100 to generate a measurement of resistance across the contacts of each switch 120a, 120b. If the resistance is too high, then it may indicate that the switches 120a, 120b need to be replaced or at least repaired.

In this embodiment, the arrangement includes the voltage sense circuit 132, which is a circuit configured to obtain a voltage measurement from the input side of each of the switches 120a, 120b. The input side of the switches 120a, 120b consists of the connection of the meter 100 to the power line 102, and is typically directly shorted to the blade 210, 270. The arrangement for detecting contact resistance also includes the voltage sensors 114a, 114b. In particular, in addition to providing normal voltage measurements for metering purposes, the voltage sensors 114a, 114b also detect voltage that located at or near the output of the switches 120a, 120b. Thus, the voltage sense circuit 132 and the voltage sensors 114a, 114b have sufficient information to determine the voltage drop over the contacts of each of the switches 120a.

As noted above, in some meters, the voltage sensors that are used for generating energy measurements are located on the input side of the disconnect switch. In such a case, the voltage sense circuit 132 may be connected to the output side of the disconnect switch.

The processing circuit 118 is operably coupled to the voltage sensor 114 and the voltage sense circuit 132 to receive the voltage detection signals. The processing circuit 118 uses the information to determine whether there is loss over the switch 120a when it is connected or closed. When the switch 120a is closed, the resistance of each switch 120a and 120b may be determined using the voltage V1 detected by the corresponding voltage sensor 114a or 114b, the voltage V2 detected on the corresponding line 102 by the voltage sense circuit 132, and the current I measured by the corresponding current sensor 116a or 116b. The processing circuit 118 determines the resistance of the switch contacts as $R=(V2-V1)/I$. The processing circuit 118 may then compare the measured resistance with a predetermined threshold to determine whether to generate a "bad contact" or "bad switch" alarm.

If the switch 120a and its contacts are in good operating order, there will be little or no significant voltage drop (V2-V1) across the switch 120a, and R will be a relatively low value. However, if the switch contacts degrade and start to exhibit poor contact, the voltage drop (V2-V1) across the switch 120a will be higher, particularly in higher current load operation.

Figure 2:
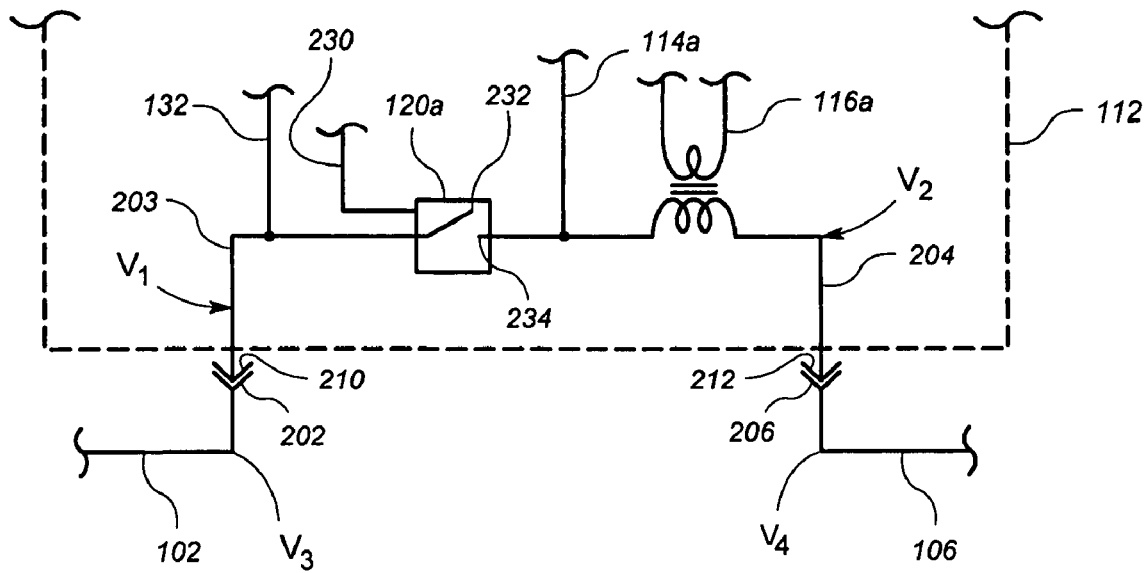
FIG. 2 shows a schematic diagram of an arrangement according to an exemplary embodiment of the invention.

FIG. 2 shows in further detail the measurement arrangement of FIG. 1 for a single phase of the meter 100. FIG. 2 shows the line 102 and feeder line 106 external to the meter, each terminating in the jaw 202 and the jaw 206, respectively. FIG. 2 further shows line current conductor 203 and a current coil 204 within the interior of the meter 100. The current conductor 203 terminates in the first current blade 210 that extends outside the housing 112 and the current coil 204 terminates in the second current blade 212 that extends outside the housing 112. The first current blade 210 is configured to be received by the jaw 202, and the second current blade 212 is configured to be received by the jaw 206.

The disconnect switch 120a includes a control line input 230, a first, contact or terminal 232 and a second contact or terminal 234. The voltage sensor 114a is coupled to current coil 204 to receive the voltage V2, which is representative of the voltage immediately downstream of the second contact terminal 234, and the voltage sense circuit 132 is coupled to the line 203 to receive the voltage V1, which is representative of the voltage immediate upstream of the first contact terminal 232. When the switch is closed, the measurements of V1 and V2 are used by the processing circuit 118 (see FIG. 1) to generate the resistance value of the switch contacts 232, 234 using the equation:

$$R=(V2-V1)/I,$$

where I is the current measured by the current sensor 116a of FIG. 1.

The processing circuit 118 then preferably compares the resistance measurement to a threshold value. If the measured resistance is greater than the threshold value, then the processing circuit 118 identifies the existence of an event representative of an unacceptable condition of the contacts of the switch 120a. The processing circuit 118 stores a corresponding alarm or event indication, and may cause the display 128 to display an indication that the event has occurred, and/or cause the communication circuit 122 to communicate a signal indicating that the event has occurred. In other embodiments, the processing circuit 118 may simply communicate the measured resistance value to another device, and/or to the display 128.

Referring again generally to FIG. 1, the contact integrity measurement may thus be carried out using multiple measurements that the meter already carries out, namely the current measurements obtained by the coils 116a, 116b, and the voltage measurements carried out by the voltage sensors 114a, 114b. The voltage sense circuit 132 may suitably be any suitable arrangement for obtaining a digital or voltage measurement. Thus, the voltage sense circuit may suitable include a voltage divider and an A/D conversion arrangement. The form or type of voltage sense circuit 132 is not central to the invention.

Figure 3:
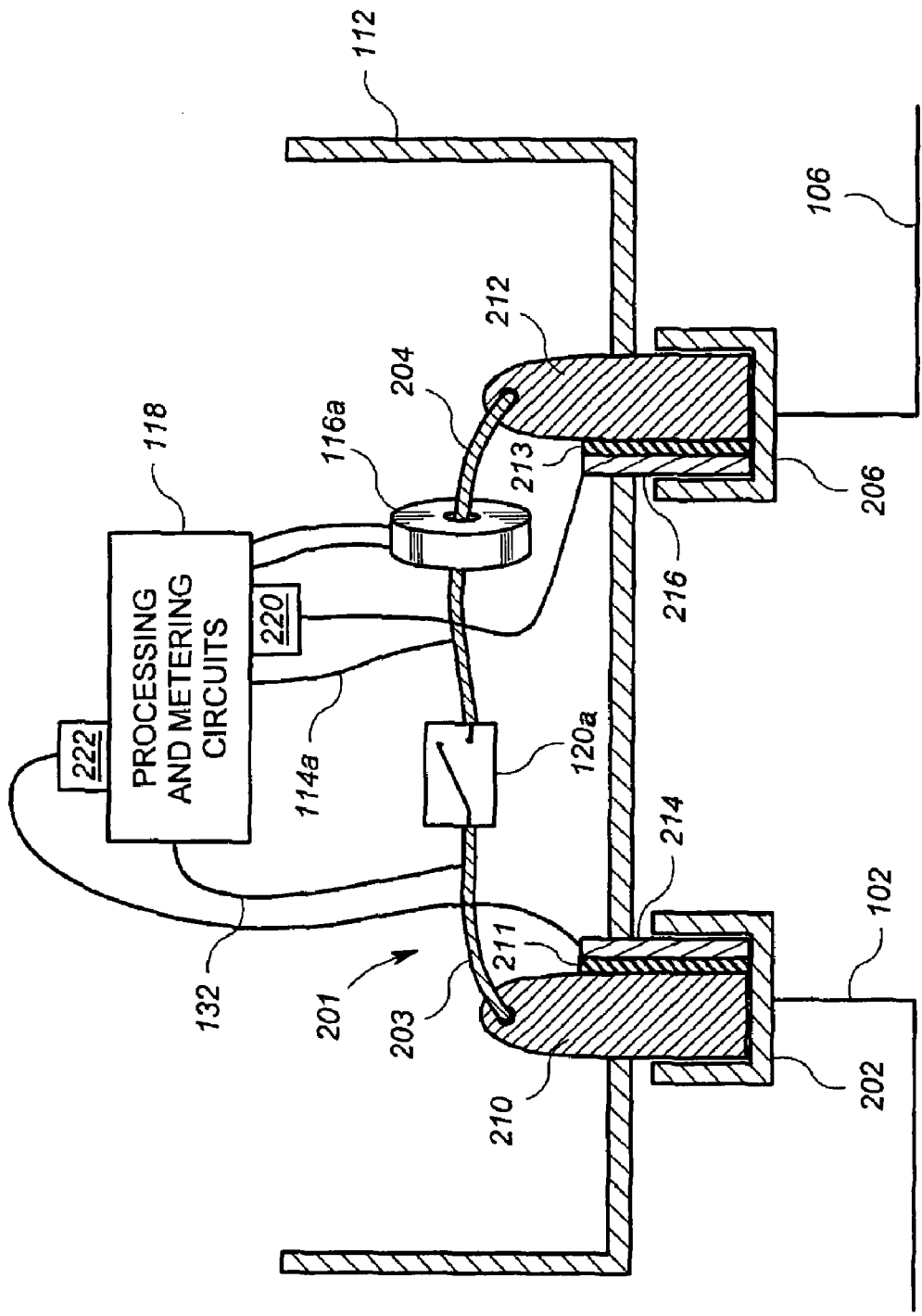
FIG. 3 shows a schematic and part cutaway view of an arrangement according to another exemplary embodiment of the invention.

It is noted that a similar method may be used to measure whether the actual meter jaws and meter blades have good contact. As discussed above, the meter 100 makes contact with the power lines 102 and the feeder lines 106 through a set of meter blades 210, 212 that are received into jaws 202, 206 of a meter mounting device. As shown in FIG. 2, the voltage sense circuit 132 obtains the voltage V1, which is representative of the voltage on the current blade 210. The voltage drop across the connection, between the blade 210 and the socket 202 further requires the socket voltage, shown as V3. FIG. 3, discussed further below, shows a configuration of probes that can obtain voltage measurements of the sockets 202 and 206 that may be used to measure meter blade/meter socket connection integrity in accordance with another embodiment of the invention.

Referring now to FIG. 3, a portion of the meter 100 and accompanying power line connections is shown in a representative schematic diagram. In particular, FIG. 3 shows the line voltage path 201 for one phase. The line voltage path 201 includes the meter blades 210, 212, the current line conductor 203, the current coil 204, the switch 120a, the current sensor 116a. FIG. 3 further shows the external connections to the line voltage path 201 of the meter 100, including the power line 102, the meter jaws 202, 206, and the feeder line 106. The meter jaws 202, 206 and meter blade 210, 212 are shown in cutaway view, while other elements are represented schematically. Also shown in FIG. 3 are the meter processing circuit 118, the voltage sense circuit 132, the voltage sensor 114a and the current sensor 116a of FIG. 1.

In accordance with this embodiment, the meter 100 further includes probes 214, 216 which are configured to obtain a voltage measurement of the meter jaws 202, 206, respectively. To obtain voltage measurements from the meter jaws 202, 206, the probes 214, 216, which are conductive and preferably pliable extend down into the jaws 202, 206 adjacent to the blades 210, 212. The probes 214, 216 in one embodiment are physically supported on or against the blades 210, 212, but are electrically isolated from the blades by respective insulation layers 211, 213, respectively. The probes 214, 216 are operably coupled to provide the processing circuit 118 with the voltage measurement at each meter jaw 202, 206.

Each of the probes 214, 216 preferably incorporates, or is couple to a high impedance voltage measurement circuit 222, 224 such that contact resistance of the probes 214, 216 within the jaws is of negligible impact on the voltage measurement. By high impedance, it is meant that each of the voltage measurement circuits 222, 224 has an impedance of over 1000 ohms, and preferably much higher. In this way, a small contact resistance of the probes 214, 216 within the jaws 202, 206 does not significantly affect the voltage measurement of the jaws 202, 206.

In a meter having satisfactory contacts within the line voltage path 201, there should be little resistance through the blades 210, 212, the line voltage conductor 203, the switch 120a, the conductive coil 204 and at the interfaces between the blades 210, 212 and the jaws 202, 206. However, if the contact between either of the blades 210 and 212 and there corresponding jaws 202, 206 is degrading, or if the contacts of the switch 120a are degrading, then there will be a voltage drop through the meter line voltage path 201.

Using the voltage measurements provided by the probes 214, 216, the voltage sense circuit 132, and the voltage sensor 114, the processing circuit 118 may obtain a measure of health of the various connections within the line voltage path 201 of the meter 100. In particular, with reference to both FIGS. 2 and 3, the processing circuit 118 has access to the voltages V3 and V4 on the jaws 202, 206, the voltage V1 on the line voltage conductor 203 and the voltage V2 on the current coil 204. The processing circuit 118 further obtains the current I through all of those elements via the current sensor 116a. The processing circuit 118 may thus determine a number of values that provide information as to resistive power losses in the line voltage path. 201 through the meter 100.

In one embodiment, the processing circuit 118 determines the resistance of the various contact connections within the line voltage path 201. These contact connections include the jaw/blades between the jaws 202, 206 and the blades 210, 212, respectively, and through the switch 120a. In each case, the resistance of jaw/blade contact is determined using the voltage drop between points on either side of the connection in contact and dividing the voltage drop by the line current in the line voltage path 201 as sensed by the current sensor 116a.

For example, the processing circuit 118 determines the resistance across the connection between the jaw 202 and the blade 210 using the formula $R_{jaw\_blade1}=(V1-V3)/I$. Similarly, the processing circuit 118 determines the resistance across the. connection between the jaw 206 and the blade 212 using the formula $R_{jaw\_blade2}=(V4-V2)/I$. As discussed above in connection with FIG. 1, the processing circuit 118 determines the resistance across the switch 120a using the formula $R_{switch}=(V2-V1)/I$.

The processing circuit 118 may then compare each of the resistance values with corresponding threshold values to determine whether a connection is degraded past an acceptable level. As discussed above, the processing circuit 118 may communicate the detection of such a condition via the display 128 or via the communication circuit 122 (see FIG. 1).

Figure 4:
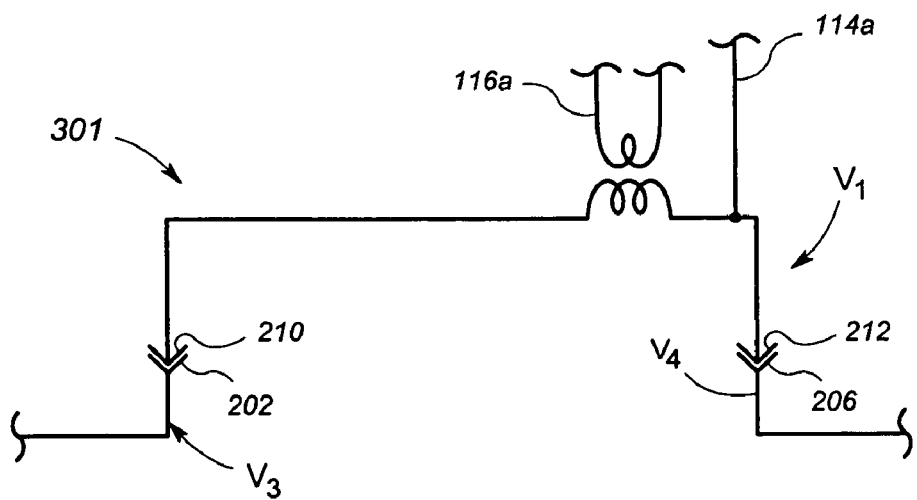
FIG. 4 shows a schematic diagram of an arrangement according to another exemplary embodiment of the invention.

It will be appreciated that many meters do not include disconnect switches 120a. In such meters, it is still useful to determine the jaw-blade resistance as a measure of the health of the meter blade, meter jaw connection. FIG. 4 shows a measurement arrangement for such an alternative. Reference numbers from the embodiment of FIG. 3 for like components in FIG. 4. In essence, the line voltage path 301 shown in FIG. 4 is identical to the line voltage path 201 of FIGS. 2 and 3 except that there is no switch 120a. As a consequence, there is no need for separate V1 and V2 measurements, but rather only a V1 measurement on the current coil 204. Indeed, in one embodiment, there is no need for a V1 measurement for the purposes of determining contact health. However, the measurement V1 is in most cases still necessary for energy consumption measurements made by the meter 100.

In one operation, the processing circuit 118 determines the effective resistance of the line voltage path 201 using the voltage V3 on the jaw 202, and the voltage V4 on the jaw 206, and the current measurement I from the corresponding current sensor 116a. The resistance through the meter 100 is determined $R=(V3-V4)/I$. If the resistance R is above a threshold, it is indicative of a possible bad contact between at least one of the blades 210, 212 and its corresponding jaw 202, 206. The processing circuit 118 may generate an alarm message that is displayed or communicated remotely. This embodiment employs probes 214, 216 similar to those shown in FIG. 3.

In one alternative embodiment, the probes 214 and 216 are not necessary. Instead, in many cases, there exist unused extra blades in a meter that are electrically connected to each of the current blades 210, 212. The extra blades, not shown, could be connected to high impedance voltage sensing circuitry and thus could operate like the probes 214, 216, while the normal blades 210, 212 actually carry the current of the load. Even if there is contact resistance between the extra blades and their corresponding sockets, the high impedance measurement circuit minimizes the impact of such contact resistance.

In the above embodiments, the processing circuit determines the resistance across a connection of the meter using the voltage drop over the connection and the measurement current. It will be appreciated that a fault in a connection can also be detecting using other values that correspond to the resistance or impedance of the connection. For example, it will be appreciated that the power consumption over a connection (i.e. the closed switches 120a, 120b, or the meter-jaw connections) also provides a measure of the health of the connection. A measure of such power loss is measured using the same values as those used to measure the resistance. In particular, power loss over a connection may be measured (or approximated) using the voltage upstream of the connection, the voltage downstream of the connection, and the current through the connection. Thus, referring to the embodiment of FIG. 1, the power loss over the switch 120a may be calculated using the same measurement arrangement, using the equation $PL=(V2*I)-(V1*I)$. This value may be compared to a threshold value to determine whether the power loss over the switch 120a indicates poor condition.

It will be appreciated that the above embodiments for determining the health of certain connections and circuits in an electricity meter is merely illustrative, and that those of ordinary skill in the art may readily devise their own implementations that incorporate the principles of the present invention and fall within the spirit and scope thereof.

We claim:

1. An arrangement, comprising:
   a) an electricity meter housing;
   b) at least one connection between a first conductor and a second conductor carrying line voltage;
   c) a processing circuit configured to obtain a first voltage measurement within the meter housing on a first side of the at least one connection, and a second voltage measurement on a second side of the at least one connection, the processing circuit further operable to determine a measurement value corresponding to an impedance across the at least one connection.

2. The arrangement of claim 1, wherein the measurement value is determined using the first voltage measurement, the second voltage measurement, and a current measurement.

3. The arrangement of claim 2, wherein the measurement value is representative of a resistance value.

4. The arrangement of claim 2, wherein the measurement value is representative of a power loss value.

5. The arrangement of claim 1, wherein the processing circuit is further operable to obtain the second voltage measurement within the meter housing.

6. The arrangement of claim 1, wherein the at least one connection includes a switch contact.

7. The arrangement of claim 1, wherein the at least one connection includes a connection between a meter blade and a meter jaw.

8. The arrangement of claim 1, wherein the at least one connection includes a connection between a first contact and a second contact of a switch.

9. The arrangement of claim 1, wherein the processing circuit is further configured to generate information regarding energy consumption of a load external to a meter based in part on the first measurement.

10. The arrangement of claim 1, further comprising a probe electrically coupled to a meter jaw.

11. The arrangement of claim 1, wherein the processing circuit is further configured to:
    determine if the resistance exceeds a threshold; and
    generate a first signal dependent on whether the resistance exceeds the threshold.

12. An arrangement, comprising:
    a) at least one connection between a first conductor and a second conductor carrying line voltage;
    b) a processing circuit disposed within an electricity meter housing, the processing circuit configured to obtain a first voltage measurement on a first side of the at least one connection, and a second voltage measurement on a second side of the at least one connection, the processing circuit further operable to determine a value corresponding to an impedance across the at least one connection.

13. The arrangement of claim 12, wherein the processing circuit is further configured to generate metering information including information regarding energy consumption of a load external to the meter.

14. The arrangement of claim 12, wherein the at least one connection includes a switch contact.

15. The arrangement of claim 12, wherein the at least one connection includes a connection between a meter blade and a meter jaw.

16. The arrangement of claim 12, wherein the at least one connection includes a connection between a first contact and a second contact of a switch.

17. The arrangement of claim 16, wherein the processing circuit is further configured to:
    determine if the value exceeds a threshold; and
    generate a first signal dependent on whether the value exceeds the threshold.

18. The arrangement of claim 12, further comprising a voltage probe configured to be received by a meter jaw, and wherein the first voltage measurement is derived from a signal obtained by the voltage probe.

19. The arrangement of claim 12, wherein the processing circuit is further configured to:
    determine if the measurement value exceeds a threshold; and
    generate a first signal dependent on whether the measurement value exceeds the threshold.

20. An arrangement, comprising:
    a) at least one connection between a first conductor and a second conductor carrying a line voltage provided to a load;
    b) a voltage sensor disposed within an electricity meter housing and configured to obtain a measurement of the line voltage;
    c) a processing circuit configured to receive the line voltage measurement from the voltage sensor, the processing circuit configured to:
    obtain a first voltage measurement on a first side of the at least one connection, and a second voltage measurement on a second side of the at least one connection, the processing circuit further operable to determine a value based on the first voltage measurement, the second voltage measurement, when said connection is conducting current.

* * * * *